United States Patent [19]

Choi

[11] Patent Number: 5,686,358
[45] Date of Patent: Nov. 11, 1997

[54] METHOD FOR FORMING A PLUG IN A SEMICONDUCTOR DEVICE

[75] Inventor: Kyeong Keun Choi, Kyoungkido, Rep. of Korea

[73] Assignee: Hyundai Electronics Industries Co., Ltd., Kyoungkido, Rep. of Korea

[21] Appl. No.: 555,789

[22] Filed: Nov. 9, 1995

[30]     Foreign Application Priority Data

Nov. 30, 1994  [KR]   Rep. of Korea .................. 1994-32252

[51] Int. Cl.$^6$ ................................................. H01L 21/467
[52] U.S. Cl. .......................... 437/195; 437/192; 437/194; 156/659.11; 156/656.1
[58] Field of Search .............................. 437/195, 192, 437/187, 194, 229, 245; 156/659.11, 656.1

[56]            References Cited

U.S. PATENT DOCUMENTS 4,987,099   1/1991   Flanner ................................. 437/192
5,459,100  10/1995   Choi ..................................... 437/195

FOREIGN PATENT DOCUMENTS 02-143529   6/1990   Japan .
03-025931   2/1991   Japan .

OTHER PUBLICATIONS

Wolf, S. et al. "Silicon Processing for the VLSI Era Vol. I" Lattice Press (1986) p. 442.

Ghandhi, S.K. "VLSI Fabrication Principles" Wiley & Sons (1983) p. 544.

Primary Examiner—John Niebling
Assistant Examiner—C. Everhart
Attorney, Agent, or Firm—Spencer & Frank

[57]            ABSTRACT

A method for forming a plug in a semiconductor device comprising the steps of: providing openings which expose an underlying layer through an insulating layer; filling selective metal layers into openings such that one of the selective metal layers is overgrown over the surface of the insulating layer in the opening having a lower topology; forming a photoresist layer on the resulting structure; patterning the photoresist layer to expose the upper surface of the overgrown selective metal layer; removing the upper portion of the overgrown selective metal layer, such that the topology of the overgrown selective metal layers is the same as that of the non-overgrown selective metal layer; and forming a metal wiring connected to the selective metal layers.

14 Claims, 5 Drawing Sheets

METHOD FOR FORMING A PLUG IN A SEMICONDUCTOR DEVICE

BACKGROUND OF THE INVENTION

The present invention relates to a method for forming a plug used for a metal wiring in a semiconductor device.

In general, conventional metalization has used a combination of sputtering processes after selectively performing a metal layer deposition process. As the devices become more highly integrated, many contact holes are formed in one device, each of which has a depth which is different from that of adjacent contact holes.

Then, if a selective metal layer is deposited on the basis of a deep contact hole, overgrowth of the selective metal layer occurs in a shallow contact hole. On the other hand, if the selective metal layer is deposited on the basis of the shallow contact hole, poor step-coverage occurs in the deep contact hole after the sputtering process.

Also, the overgrown selective metal layer may cause a short circuit in the device and have an effect on the align key at the time of exposing the device to a stepper.

SUMMARY OF THE INVENTION

An object of the present invention is to provide a method for forming a plug in a semiconductor device having contact holes, of different depths while preventing the overgrowth of the plug and poor step-coverage which could cause generation of a short circuit in a highly integrated circuit, in order to improve the characteristics of the device and the throughput thereof.

In accordance with the preferred embodiment of the present invention, a method for forming a plug in a semiconductor device is produced comprising the steps of: providing openings which expose an underlying layer through an insulating layer; filling selective metal layers into openings such that one of the selective metal layers is overgrown over the surface of the insulating layer in the opening having a lower topology; forming a photoresist layer on the resulting structure; patterning the photoresist layer to expose the upper surface of the overgrown selective metal layer; removing the upper portion of the overgrown selective metal layer, such that the topology of the overgrown selective metal layers is the same as that of the non-overgrown selective metal layer; and forming a metal wiring connected to the selective metal layers.

BRIEF DESCRIPTION OF THE DRAWINGS

The subject matter which is regarded as the invention is particularly pointed out and distinctly claimed in the concluding portion of the specification. The invention, however, both as to organization and method of practice, together with further objects and advantages therof, may best be understood by reference to the following description taken in connection with the accompanying drawings, which:

DETAILED DESCRIPTION OF THE INVENTION

Figure 1:
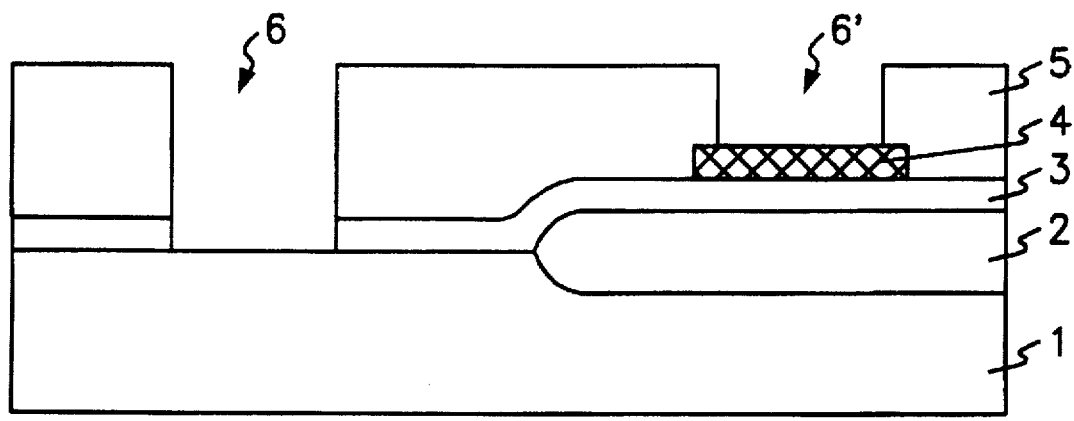
FIGS. 1 and 2 are cross-sectional views illustrating the process of making a plug using a selective metal layer.

FIG. 1 illustrates the structure of a device having a plurality of first openings wherein one of the openings 6' has a first depth and a second of the openings 6 has a second depth, the first depth being less than the second depth. The first opening 6' exposes a conducting layer 4.

In FIG. 1, the numeral 1 denotes a substrate, 2 denotes a field oxide layer, 3 denotes an insulating layer, and 5 denotes an insulating layer where the openings 6 and 6' are formed.

Figure 2:
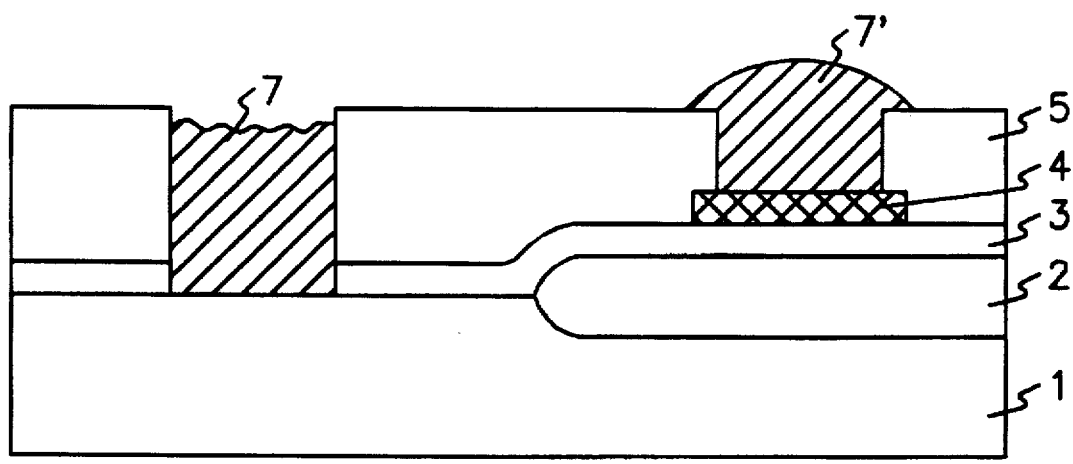

As stated above, since the depth of the opening 6 is deeper than that of the opening 6', an overgrown selective metal layer 7'(hereinafter, referred to as the first plug) is generated over the surface of the insulating layer 5, as shown in FIG. 2, when the selective metal layer 7(hereinafter, referred to as the second plug) in the deeper contact hole is formed without overgrowing, using chemical the vapor deposition(CVD) method. The selective metal layer is tungsten (W) , aluminum, copper or the like, which is now used in the process of fabricating semiconductor devices.

An embodiment of the present invention will be described referring to FIGS. 3 to 7.

Figure 3:
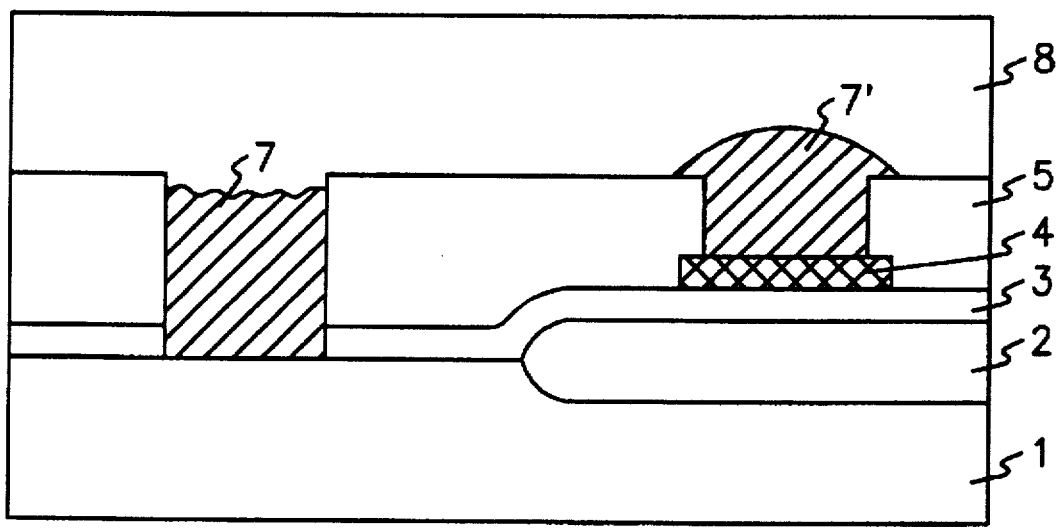
FIGS. 3 to 7 are cross-sectional views illustrating the process of making a plug in accordance with an embodiment of the present invention.

As shown in FIG. 3, the surface of the structure in FIG. 2 is coated with a photoresist layer 8.

Figure 4:
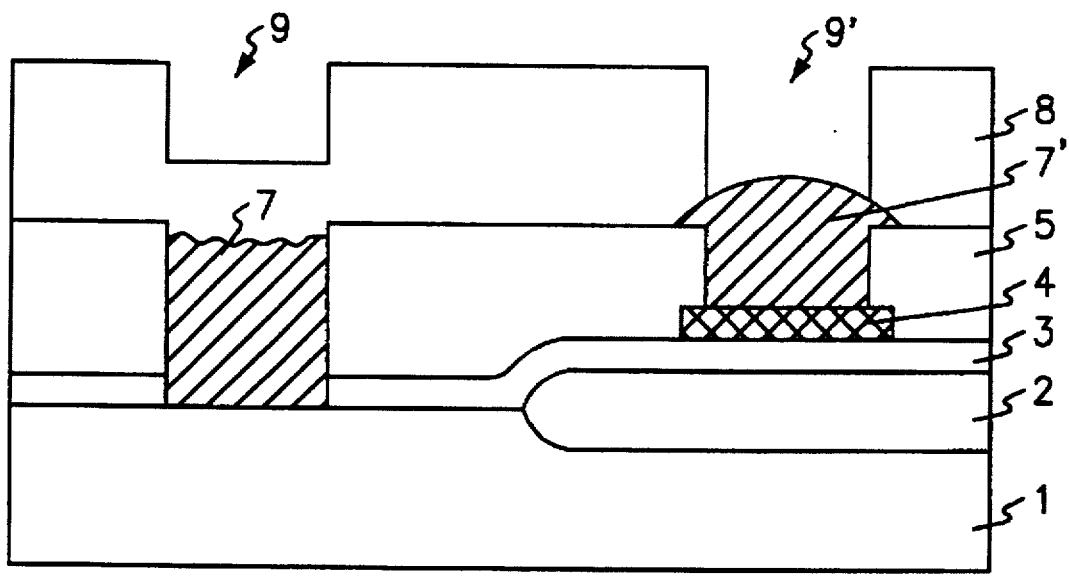

Next, as shown in FIG. 4, the photoresist layer 8 is exposed over the openings 6 and 6' of FIG.1 and then openings 9 and 9' are formed. At this time, the exposure time must be controlled not to expose the second plug 7 in the deeper opening and to expose the first plug. In the preferred embodiment, the photoresist layer has a thickness of 0.5 to 1.5 μm, and the exposure time controlled so as to be less than about 50 seconds.

Figure 5:
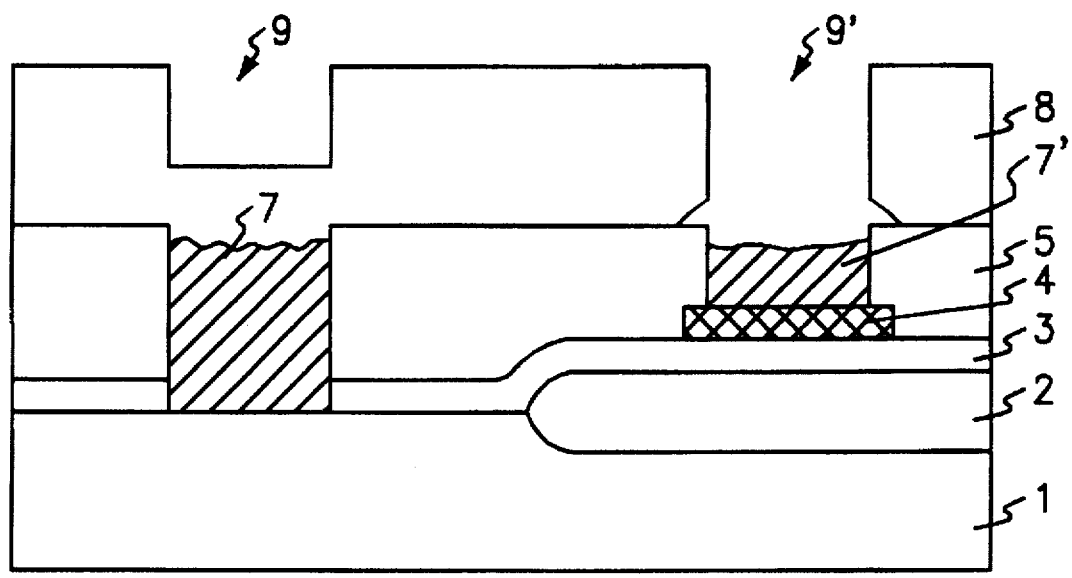

As shown in FIG.5, after patterning the photoresist layer 8, a wet-etching is applied to the resulting structure to etch back the overgrown part of the second plug 7', using a $H_2O_2$ solution. Also, the wet-etching time must be controlled. In the case of tungsten, when the overgrown part is 4000Å, the time of the wet-etching is approximately 40 seconds. When the overgrown part of the first plug 7' is removed, the topology of the first and second plugs 7' and 7 are the same. This is accomplished by controlling processing conditions, and is shown in FIG. 5.

Figure 6:
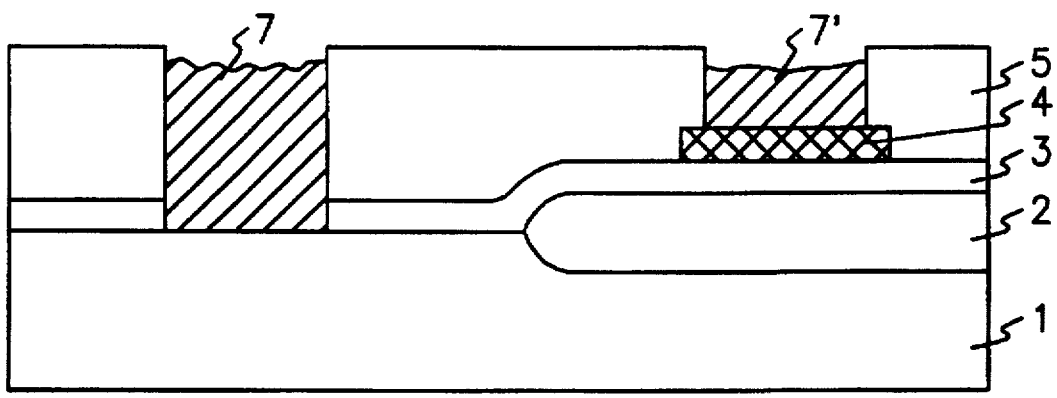
Figure 7:
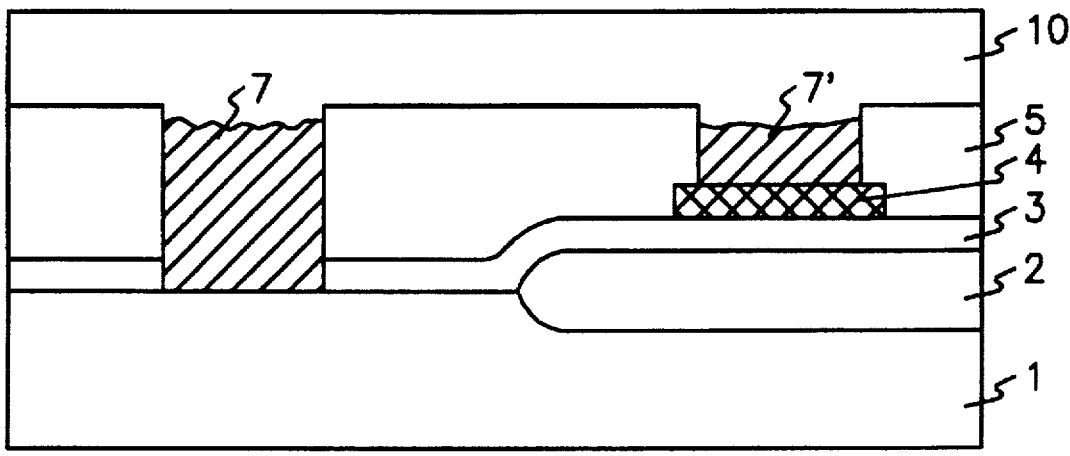

The photoresist layer 8 is removed as shown in FIG. 6, and an aluminum wiring 10 is formed on the surface of the resulting structure as shown in FIG. 7.

Figure 9:
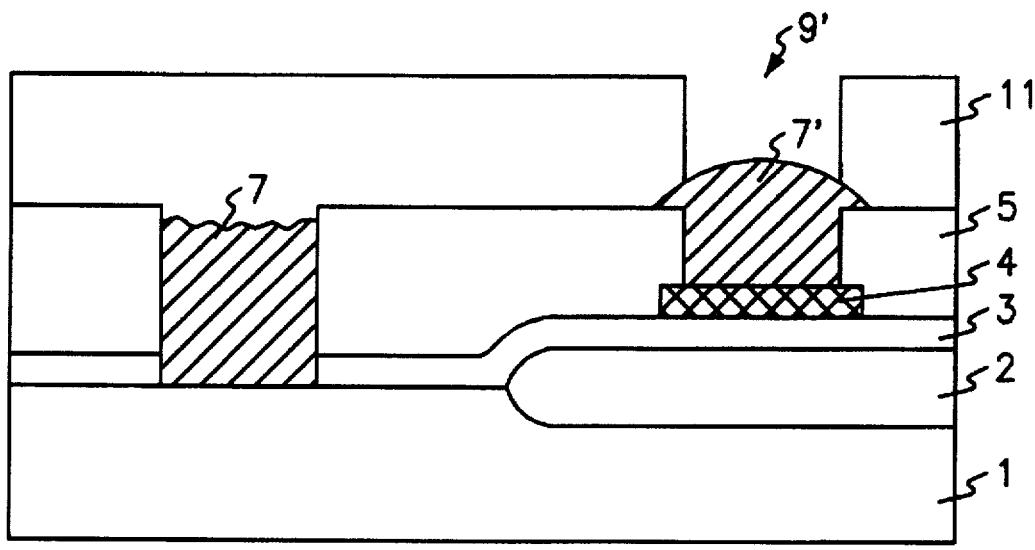
Figure 10:
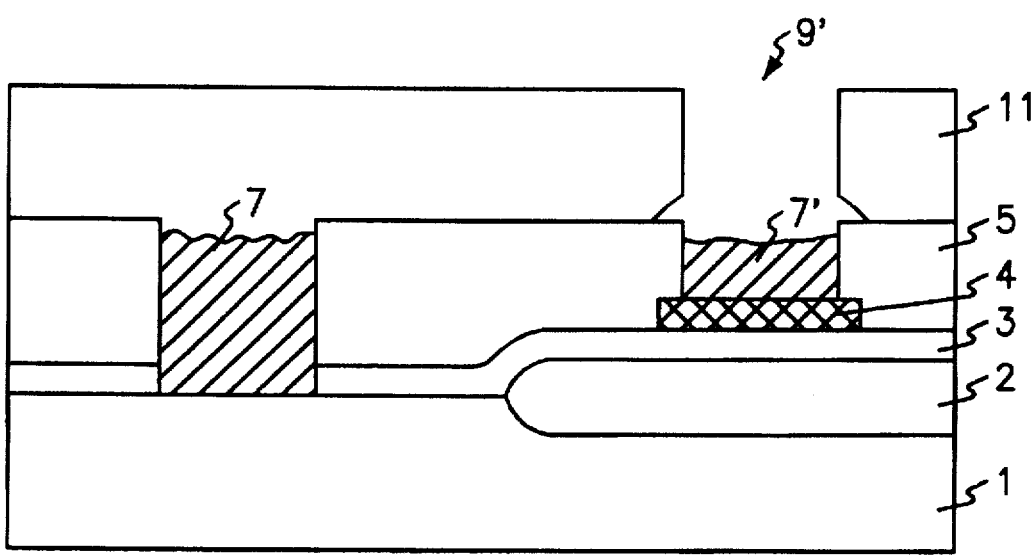

Another embodiment of the present invention will be described referring to FIGS. 8 to 10.

Figure 8:
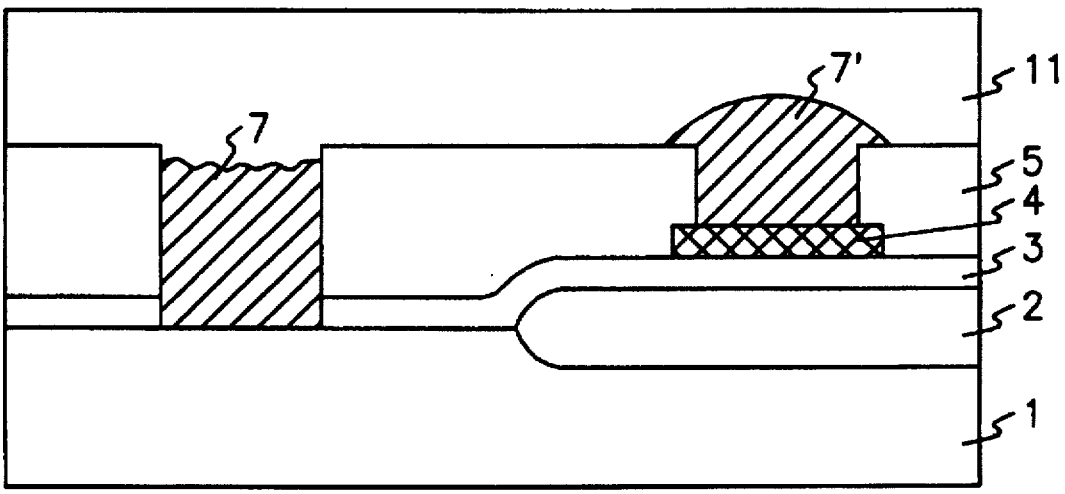
FIGS. 8 to 10 are cross-sectional views illustrating the process of making a plug in accordance with another embodiment of the present invention.

FIG. 8 has a photoresist layer 11 as in the case of FIG. 3. Furthermore, FIGS. 9 and 10 are respectively the same as FIGS. 4 and 5 except for the photoresist pattern formed by layer 11 . That is to say, FIGS. 9 and 10 show photoresist layer 11 having only one opening 9' which exposes the overgrown part the first plug 7'. Also, and the result of the wet-etching process is different from that of FIG. 5.

As mentioned above, the present invention provides improved step-coverage in semiconductor devices, by removing the overgrown part of the plug in the shallow opening, which increases the throughput and reliability of the devices.

The invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims.

What is claimed is:

1. A method for forming a plug in a semiconductor device comprising the steps of:

providing first openings which expose an underlying layer through an insulating layer;

filling selective metal layers into said openings such that one of the selective metal layers is overgrown over the surface of the insulating layer in an opening having a lower topology than another of said first openings;

forming a photoresist layer on the resulting structure;

forming at least one second opening through the photoresist layer to expose an upper portion of the overgrown selective metal layer;

removing the upper portion of the overgrown selective metal layer, such that the topology of the overgrown selective metal layers is the same as that of a non-overgrown selective metal layer; and forming a metal wiring connected to the selective metal layers.

2. A method in accordance with claim 1, wherein the selective metal layers are formed by chemical vapor deposition.

3. A method in accordance with claim 1, wherein the selective metal layers are selected from the group consisting of one of tungsten, aluminum and copper.

4. A method in accordance with claim 1, wherein the step of removing the upper portions of the overgrown selective layers is performed by wet-etching.

5. A method in accordance with claim 1, wherein the steps of providing the first and second openings use a photomask, the same photomask being used to provide the first and second openings.

6. A method for forming a plug in a semiconductor device comprising the steps of:

(a) providing a plurality of first openings in an insulating layer of the semiconductor device, one of said openings having a first depth and another of said openings having a second depth, for exposing an underlying layer of said device, said first depth being less than said second depth;

(b) forming first and second selective metal layers within said first openings of said first depth and said second depth, respectively, such that an upper portion of the first selective metal layer overgrows the surface of said insulating layer and an upper portion of said second selective metal layer does not overgrow the surface of said insulating layer;

(c) forming a photoresist layer on the structure resulting from step (b);

(d) providing a second opening in said photoresist layer to expose the upper portion of the first selective metal layer;

(e) removing the upper portion of said first selective metal layer through said second opening so that said first selective metal layer does not project from the surface of said insulating layer; and forming a metal wiring over the structure resulting from step (e), thereby connecting said wiring to said selective metal layers.

7. A method in accordance with claim 6, wherein the selective metal layers are formed by chemical vapor deposition.

8. A method in accordance with claim 6, wherein the selective metal layers are selected from the group consisting of one of tungsten, aluminum and copper.

9. A method in accordance with claim 6, wherein the step of removing the upper portion of the first selective metal layer is performed by wet-etching.

10. A method in accordance with claim 6, wherein the steps of providing said first openings of said first and second kind, and said second opening, uses the same photomask.

11. A method in accordance with claim 6, wherein the photoresist layer has a thickness of 0.5 to 1.5 µm.

12. A method in accordance with claim 11, wherein the said photoresist layer is exposed for approximately 50 seconds.

13. A method in accordance with claim 1, wherein the photoresist layer has a thickness of 0.5 to 1.5 µm.

14. A method in accordance with claim 6, wherein said photoresist layer is exposed for approximately 50 seconds.

* * * * *